(12) United States Patent
El Rai et al.

(10) Patent No.: US 7,795,991 B2
(45) Date of Patent: Sep. 14, 2010

(54) INTEGRATED CIRCUIT ARRANGEMENT TO SET A PHASE DIFFERENCE

(75) Inventors: Samir El Rai, Colorado Springs, CO (US); Ralf Tempel, Duisburg (DE)

(73) Assignee: Atmel Duisburg GmbH, Duisburg (DE)

( * ) Notice: Subject to any disclaimer, the term of this patent is extended or adjusted under 35 U.S.C. 154(b) by 0 days.

(21) Appl. No.: 11/836,767

(22) Filed: Aug. 9, 2007

(65) Prior Publication Data

US 2008/0157900 A1 Jul. 3, 2008

Related U.S. Application Data

(60) Provisional application No. 60/836,369, filed on Aug. 9, 2006.

(30) Foreign Application Priority Data

Aug. 9, 2006 (DE) .................. 10 2006 037 193

(51) Int. Cl.
*H01P 9/00* (2006.01)
*H04B 1/38* (2006.01)
(52) U.S. Cl. .................. 333/18; 375/219; 455/73
(58) Field of Classification Search .................. 333/2, 333/4, 5, 17.1, 18, 138–140, 156, 165; 455/73, 455/77; 375/219, 220
See application file for complete search history.

(56) References Cited

U.S. PATENT DOCUMENTS 4,751,453 A * 6/1988 Foti .................. 323/212

(Continued)

FOREIGN PATENT DOCUMENTS

EP 0 138 369 4/1985

OTHER PUBLICATIONS

White Paper, RF Spectrum Utilization in WiMAX, Nov. 2004, Fujitsu Microelectronics America, p. 5.*

(Continued)

*Primary Examiner*—Benny Lee
*Assistant Examiner*—Gerald Stevens
(74) *Attorney, Agent, or Firm*—Muncy, Geissler, Olds & Lowe, PLLC

(57) ABSTRACT

An integrated circuit arrangement (1; 2; 3; 4) for setting a predefined phase difference (phi_target) between a first high-frequency signal (x1; x1p, x1n) and a second high-frequency signal (x2; x2p, x2n), comprising:

e) a chain connection of a plurality (N) of basic circuits (10; 20; 30; 40), whereby each basic circuit has a first transmission line (11; 11*p*, 11*n*) for transmitting the first signal (x1; x1p, x1n), a second transmission line (12; 12*p*, 12*n*) for transmitting the second signal (x2; x2p, x2n), and a controllable phase-influencing means (13; 23; 33; 43), connected to the first transmission line, for controllably influencing the phase of the first signal, f) a phase difference detector (14; 34), which is connected to the output-side basic circuit and is formed to detect a current phase difference (phi_actual) between the first and second signal, g) a control unit (15; 35), which is connected to the phase difference detector and each controllable phase-influencing means (13; 23; 33; 43) and is formed to generate first digital control voltages, dependent on the current phase difference (phi_actual), as control signals (vt1, vt2, ... ) for each phase-influencing means (13; 23; 33; 43), whereby the digital control voltage can assume only two different voltage values, and h) whereby each controllable phase-influencing means (13; 23; 33; 43;) has at least one first tunable capacitive unit (16; 16*p*, 16*n*; 46*p*, 46*n*), which is connected to the first transmission line and the control unit and is designed to delay the first signal depending on one of the first control signals.

21 Claims, 5 Drawing Sheets

U.S. PATENT DOCUMENTS

| | | | |
|---|---|---|---|
| 5,083,100 A | | 1/1992 | Hawkins et al. |
| 5,306,971 A | * | 4/1994 | McCune .................. 327/270 |
| 5,352,994 A | * | 10/1994 | Black et al. .................. 333/33 |
| 6,369,671 B1 | | 4/2002 | Bertin et al. |
| 2002/0167366 A1 | * | 11/2002 | Sanduleanu et al. ......... 331/185 |
| 2005/0264335 A1 | * | 12/2005 | Soe ............................ 327/261 |

OTHER PUBLICATIONS

El Rai et al., "New Design of Differential Transmission Lines on Silicon", IEEE, Digest of Papers, Jan. 2006, pp. 101-102.

El Rai et al., "Differential Transmission Lines on Silicon Based on Periodic Photonic Bandgap Structures", IEEE, Digest of Papers, Jan. 2006, pp. 101-102.

Nagara et al., "Distributed Analog Phase Shifters with Low Insertion Loss", Distributed Analog Phase Shifters with Low Insertion Loss, IEEE Service Center, Piscataway, NJ, US, BD. 47, Nr. 9, Sep. 1999, pp. 1705-1711.

\* cited by examiner

INTEGRATED CIRCUIT ARRANGEMENT TO SET A PHASE DIFFERENCE

This nonprovisional application claims priority to German Patent Application No. DE 102006037193, which was filed in Germany on Aug. 9, 2006, and to U.S. Provisional Application No. 60/836,369, which was filed on Aug. 9, 2006, and which are both herein incorporated by reference.

BACKGROUND OF THE INVENTION

1. Field of the Invention

The present invention relates to an integrated circuit arrangement for setting a predefined phase difference between a first and second high-frequency signal. The invention relates furthermore to an integrated circuit having a circuit arrangement of this type.

2. Description of the Background Art

The invention is within the field of integrated circuits (IC) in which high-frequency signals are transmitted with a fixed phase relation. The invention is in particular within the field of integrated high-frequency front-end circuits, with whose help a high-frequency (HF) incoming signal in transmitting/receiving devices of communication systems, such as, e.g., a radio signal in the gigahertz range received over an antenna, is converted into a quadrature signal with a fixed, low frequency (intermediate frequency, IF), before the signal is demodulated and the data values contained therein, originating from another transmitting/receiving device, are detected.

Prior-art integrated HF front-end circuits have a low-noise amplifier (LNA) and a quadrature-mixer for spectral down conversion of the amplified signal. To derive the quadrature signal, the quadrature mixer, also called an image reject mixer, contains two mixers, controlled by two local oscillator signals, phase-shifted by 90 degrees relative to one another. In the case of such local oscillator signals (and in other signals of the HF front-end circuit), these are usually differential signals whose components have a phase difference of 180 degrees. To reduce feedback effects of the mixer on the local oscillator, the mixer and the local oscillator are typically placed at a relatively large distance from the integrated circuit.

Because of technology or process variations and/or because of design asymmetries, deviations from the ideal phase offset of 90 or 180 degrees may occur, which may greatly impair the efficiency of the HF front-end circuit. In prior-art receivers, such phase deviations in the intermediate frequency or baseband range are compensated by multiplying, e.g., a digitalized quadrature signal with a complex-valued factor in such a way that the desired phase offset of 90 or 180 degrees is restored.

The calibration circuits, e.g., based on switchable resistance networks, require chip area. In addition, the calibration range, i.e., the maximum deviation from the ideal phase offset that can be corrected in this way, is relatively small and the precision (resolution) of the phase correction relatively low. The necessary phase relation can be set in a relatively narrow band in this way.

SUMMARY OF THE INVENTION

It is therefore an object of the present invention to provide an integrated circuit arrangement, which is simple and cost-effective to implement and enables a phase setting with the lowest area requirement possible.

The integrated circuit arrangement of the invention has a chain connection of a plurality of basic circuits, whereby each basic circuit has a first transmission line for transmitting the first signal, a second transmission line for transmitting the second signal, and a controllable phase-influencing means, connected to the first transmission line, for controllably influencing the phase of the first signal. Furthermore, the circuit arrangement has a phase difference detector, which is connected to the output-side basic circuit and is formed to detect a current phase difference between the first and second signal.

Furthermore, the circuit arrangement has a control unit, which is connected to the phase difference detector and each controllable phase-influencing means and is formed to generate first control voltages dependent on the current phase difference as control signals for each phase influencing means, whereby the digital control voltage can assume only two different voltage values.

Each controllable phase-influencing means has at least one first tunable capacitive unit, which is connected to the first transmission line and the control unit and is designed to delay the first signal depending on a digital control voltage of the first control signal.

Advantageous embodiments and developments of the invention are to be derived from the dependent claims and from the description particularly with reference to the drawing.

Preferably, the control unit is designed to tune the first capacitive units in such a way that the first signal, when it is transmitted over the first transmission lines, experiences a first total time delay, so that the predefined phase difference arises between the first and second signal.

In an advantageous embodiment, the integrated circuit has an oscillator, a quadrature mixer, and a circuit arrangement of the invention connected to the oscillator and the quadrature mixer.

Preferably, a plurality of basic circuits is provided, each of which has a first transmission line for transmitting the first signal and at least one first tunable capacitive unit connected to said transmission line, whereby the control unit according to the current phase difference sets the first capacitive units so that the desired phase difference arises on the output side. In this way, the chip area required in any event by the transmission lines is used in addition for setting the desired phase difference, for which reason the circuit arrangement of the invention has a reduced area requirement. Because of the plurality of tunable capacitive units, the circuit arrangement of the invention, moreover, has a broad control range and a high phase setting resolution. In addition, the circuit arrangement can be used flexibly and advantageously at different frequencies or in different frequency bands.

According to a preferred development, the control unit has a conversion unit particularly an analog-to-digital converter.

In an advantageous development, the control unit is designed in addition to generate analog control voltages, dependent on the current phase difference, as continuous-value control signals for at least one of the phase-influencing means. For example, for fine tuning one of the phase-influencing means may be set in a middle range of the capacitance-voltage characteristic, whereby the middle range has a significantly higher voltage dependence than the ranges of the digital voltages.

In an advantageous embodiment, the basic circuits are designed substantially as identical. As a result, the integrated circuit arrangement is especially simple to develop and to realize.

Preferably, the number of basic circuits is selected in such a way that the electrical length of an individual basic circuit is less than a tenth of the effective wavelength of the first signal. As a result, the homogeneous properties of the transmission lines are retained.

In a preferred embodiment, each first transmission line has a first trace for transmitting a noninverted first component of the first signal and a second trace for transmitting an inverted second component of the first signal and each basic circuit has a controllable phase-influencing means, connected to the first and second trace, for controllably influencing the phases of the first and second component, whereby each controllable phase-influencing means has at least one first series circuit, which is connected between the first and second trace and is connected to the control unit, comprises two first tunable capacitive units, and is designed to delay the first and second component depending on one of the first control signals, and whereby the control unit is designed to tune the first capacitive units in such a way that the first and second components, when they are transmitted over the first or second traces, experience a matching first total time delay, so that the predefined phase difference arises between the first and second signal. As a result, the phase difference can be set advantageously to a desired value also in the case of a differential first signal.

Preferably, the traces are designed meander-shaped. As a result, advantageously long electrical lengths or phase shifts are achieved with small geometric dimensions.

In an advantageous embodiment, the first capacitive units are arranged between the first and second traces. As a result, the chip area requirement can be reduced further.

In another advantageous embodiment, the phase difference detector is formed to detect another current phase difference between the first and second component and the control unit is formed to generate at least two third control signals and at least two fourth control signals, which depend on the additional current phase difference, whereby each controllable phase-influencing means has at least one third tunable capacitive unit, which is connected to the first trace and the control unit and is designed to delay the first component depending on one of the third control signals, whereby each controllable phase-influencing means has at least one fourth tunable capacitive unit, which is connected to the second trace and the control unit and is designed to delay the second component depending on one of the fourth control signals, and whereby the control unit is designed to tune the third and fourth capacitive units in such a way that the first and second components, when they are transmitted over their respective traces, experience a third or fourth total time delay, respectively, so that another predefined phase difference arises between the first and second component. By this means, deviations from a 180-degree phase offset between the first and second component of the first signal can be advantageously corrected.

In a preferred embodiment, each basic circuit has a controllable phase-influencing means, connected to the second transmission line, for controllably influencing the phase of the second signal and the control unit is formed to generate at least two second control signals dependent on the current phase difference. Each controllable phase-influencing means in this case has at least one second tunable capacitive unit, which is connected to the second transmission line and the control unit and is designed to delay the second signal depending on one of the second control signals. The control unit is designed to tune the second capacitive units in such a way that the second signal, when it is transmitted over the second transmission lines, experiences a second total time delay, so that the predefined phase difference arises between the first and second signal. In this way, a symmetric control range is advantageously made possible so that upward and downward phase deviations can be similarly corrected.

In other advantageous embodiments, all first and/or second capacitive units are designed as identical. As a result, the integrated circuit arrangement is especially simple to develop and to realize.

BRIEF DESCRIPTION OF THE DRAWINGS

The invention will be described in greater detail hereafter with use of the exemplary embodiments shown in the schematic figures of the drawing. Here, the figures show the following.

DETAILED DESCRIPTION

Figure 1:
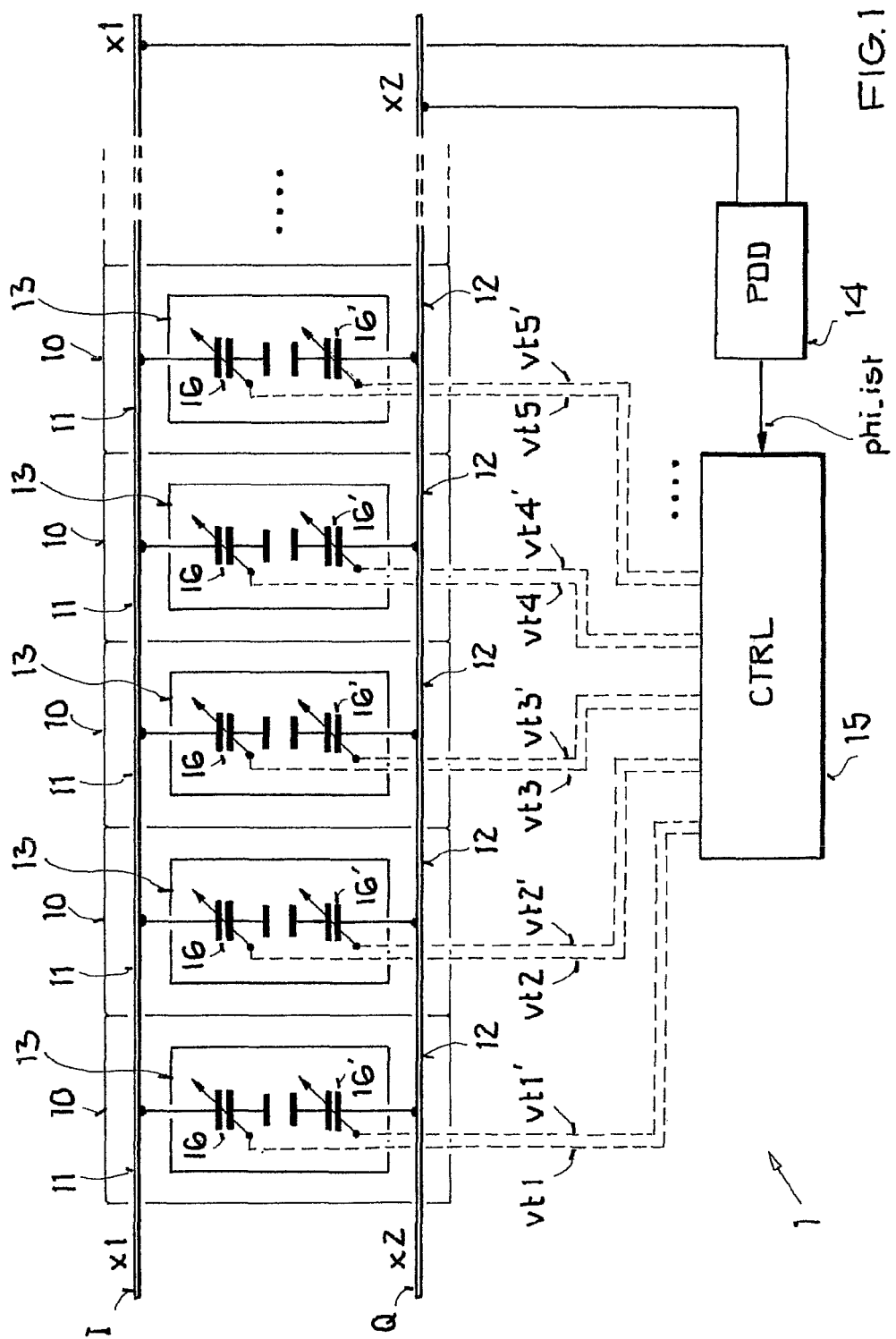
FIG. 1 a first exemplary embodiment of a circuit arrangement of the invention.

In the figures, the same and functionally identical elements and signals, if not specified otherwise, are provided with the same reference characters.

FIG. 1 shows a circuit diagram of a first exemplary embodiment of a circuit arrangement of the invention.

The high-frequency signals x1 and x2 are applied at the integrated circuit arrangement 1 on the input side (on the left in the figure), whereby these are, for example, in the case of x1 the inphase component (I) and in the case of x2 the quadrature phase component (Q) of a local oscillator signal in the gigahertz range. Circuit arrangement 1 makes certain that at its output the signals x1 and x2 have as precisely as possible a predefined phase difference (phase offset) phi_target, which in this case (I/Q offset) is 90 degrees.

Circuit arrangement 1 has a chain connection (series connection) of a plurality N of basic circuits 10, whereby at least two basic circuits are provided. For example, N=50 basic circuits are provided. Each basic circuit 10 comprises a transmission line 11 for transmitting the signal (the electromagnetic wave) x1, a transmission line 12 for transmitting the signal x2, and a controllable phase-influencing means 13, connected to transmission lines 11, 12, for controllably influencing the phases of both signals x1, x2.

Transmission lines 11, 12 are preferably formed as traces, which are arranged in one or more metallization levels of an integrated circuit (IC), in which phase-influencing means 13 are also integrated.

Furthermore, circuit arrangement 1 has a phase-difference detector (PDD) 14 and a control unit (CTRL) 15 connected downstream. On the input side, phase-difference detector 14 is connected optionally via a buffer or amplifier to transmission lines 11, 12 of the output-side basic circuit, shown on the right in FIG. 1. Control unit 15 is connected on the output side to each phase-influencing means 13.

Phase difference detector 14 detects the current (actual) phase difference phi_actual between the two signals x1 and x2 and provides a voltage with a value that is assigned to the detected phase difference phi_actual. For example, a voltage value of 0 V corresponds to a phase difference phi_actual of 80 degrees, a value of 0.5 V to a phase offset phi_actual of 90 degrees (=phi_target), and a value of 1 V to an offset phi_actual of 100 degrees.

Control unit 15 generates N first control signals vt1, vt2, vt3, . . . and N second control signals vt1', vt2', vt3', . . . for controlling phase-influencing means 13. These 2N control signals depend on the current (actual) phase difference phi_actual and possibly on earlier (actual) phase differences. They can be formed in each case as a digital control voltage, which may assume only two different voltage values (e.g., 0 V, 3 V). The control by a digital signal makes possible a correspondingly high resolution with a large plurality of phase-influencing means 13. Furthermore, the control by means of the first digital control signals produces the surprising effect that for each of the two digital voltage values it is possible to set a capacitance value as an operating point, in which the capacitance changes only very slightly during modulation around this operating point. If, in contrast, the phase-influencing means is to be controlled in an analog manner by a continuous voltage, it must be operated in a range with a large voltage dependence in the set operating point, which has a negative effect on the precision and distortion of the signal to be delayed and may possibly couple interfering signals to the control signals onto the signal to be delayed.

If the resolution by the digital control signal is not sufficient, additional intermediate values can be obtained by an analog control signal, whereby because of the plurality of digitally controlled phase-influencing means, the negative effect of the voltage dependence of the one analog controlled phase-influencing means is negligible in relation to that of an analog phase-influencing means. An analog control voltage with continuous values can be formed, e.g., between 0 V and 3 V.

Control unit 15 is preferably formed as a conversion unit, which converts each voltage value of phase difference detector 14 or else a time mean value of voltage values or a filtered voltage value into a set of values, assigned to said first voltage value (mean value, filtered value), of the first and second control signals. In an embodiment, the control unit had an analog-to-digital converter.

Each controllable phase-influencing means 13 has (at least) one first tunable capacitive unit 16 connected to transmission line 11, a reference potential (AC ground), and control unit 15, with whose aid the distributed capacitance of transmission line 11 and thereby the wave propagation speed of the signal x1 travel time can be changed depending on one of the first control signals vt1, vt2, . . . . In addition, each phase-influencing means has (at least) one second tunable capacitive unit 16' connected to transmission line 12, a reference potential (AC ground), and control unit 15, said capacitive unit which delays signal x2 in each case depending on one of the second control signals vt1', vt2', . . . . Tunable capacitive units 16, 16' may have a discretely settable and/or a continuously settable capacitance value.

By means of the first and second control signals, control unit 15 tunes capacitive units 16 and 16' in such a way that signals x1 and x2, when they are transmitted over the respective transmission lines, experience a total time delay T1 or T2, so that as a result of the possibly resulting time offset T1-T2, at the output of circuit arrangement 1, the predefined (target) phase difference phi_target arises between signals x1 and x2.

The control unit can adjust the phase difference quasi-time continuously based on the instantaneous actual phase difference phi_actual detected at each time point or else based on averaged or filtered values of the actual phase difference phi_actual. In other embodiments, the control unit regulates the phase difference only within certain, e.g., regularly recurring intervals or else only when certain conditions are present, such as, e.g., a temperature increase that is above a specific threshold. A one-time trimming after the completion of the manufacturing process of the integrated circuit arrangement is thus also made possible.

In a preferred embodiment, all capacitive units 16, 16' are designed as identical, so that they have the same capacitance value C at a matching value of their respective controls signal. Integrated circuit arrangements of this type can be advantageously developed and realized very simply and cost-effectively.

In another advantageous embodiment, all (or at least most, see next paragraph) phase-influencing means 13 are controlled by two-valued control signals, which, e.g., can assume only the voltage values 3 V or 0 V. Each capacitive unit 16, 16', depending on the applied value of its control signal, assumes either a first (e.g., minimal) capacitance value Cmin or else a second (e.g., maximum) capacitance value Cmax, so that the capacitive units are formed switchable between these capacitance values. An integrated circuit arrangement of this type with phase-influencing means controlled in a digital or binary fashion is especially simple to realize.

It is especially advantageous, apart from a plurality (e.g., 48) of digitally controlled phase-influencing means, to control a few (e.g., 2) phase-influencing means 13 by analog (continuous-value) control signals. In this manner, at the output of a circuit arrangement of this type, it is possible to maintain the predefined phase difference phi_target more precisely, so that in this way advantageously a higher precision of the phase setting is achieved.

Capacitive units 16, 16' are preferably formed as varactors, MOS capacitors, or as MOS transistors. In the case of a MOS transistor, the gate terminal is connected to the respective transmission line, whereas the drain and source terminals are connected to one another and to a reference potential (AC ground).

In an embodiment which is not shown, the phase-influencing means delay exclusively signal x1 but not signal x2. In comparison to FIG. 1, in this exemplary embodiment, the second tunable capacitive units 16' and the second control signals vt1', vt2', . . . are eliminated.

Figure 2:
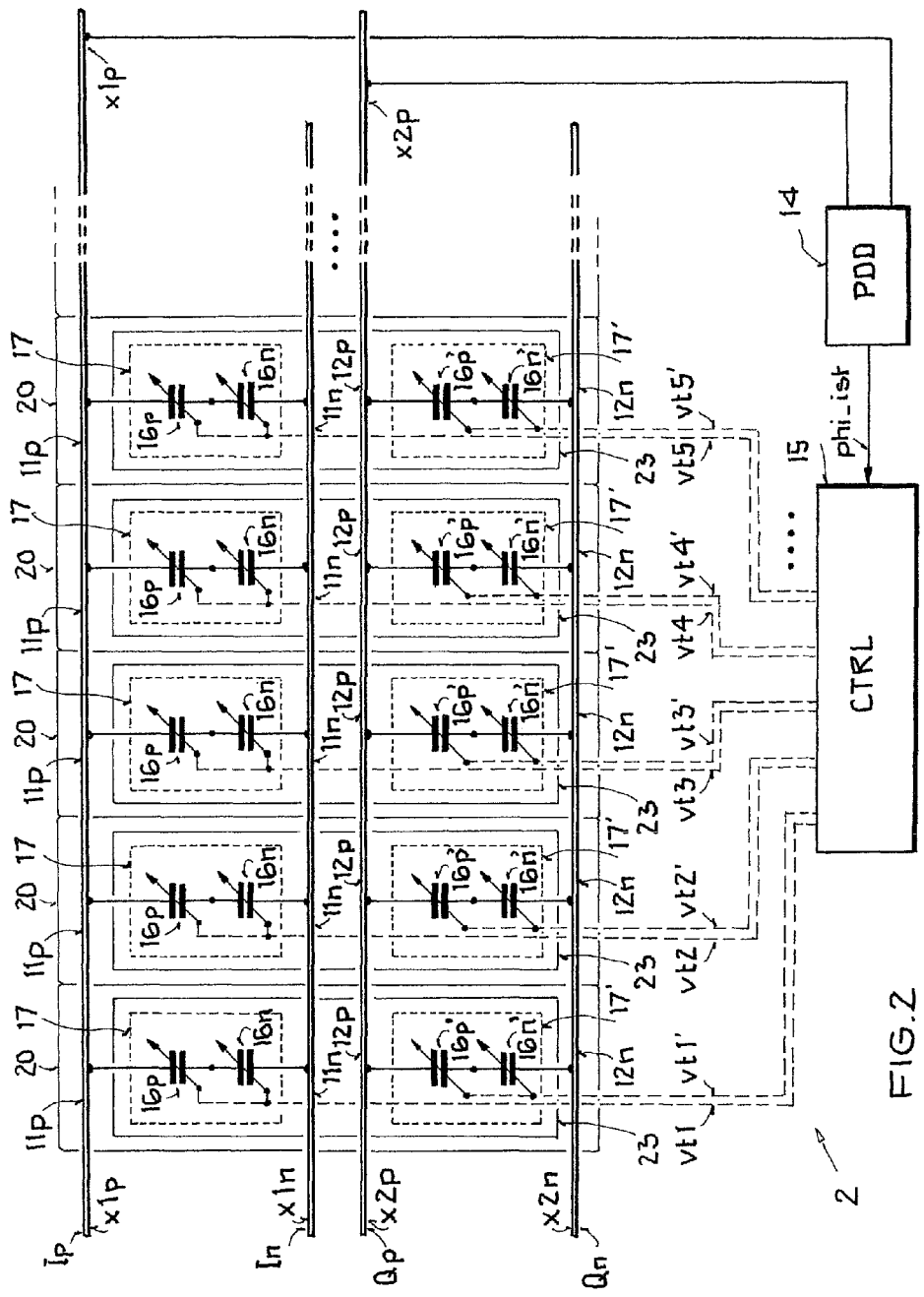
FIG. 2 a second exemplary embodiment of a circuit arrangement of the invention.

FIG. 2 shows a circuit diagram of a second exemplary embodiment of a circuit arrangement of the invention for two differential signals x1 and x2, each of which has a noninverted (positive) component x1p or x2p, respectively, and an inverted (negative) component x1n or x2n, respectively.

Signal components x1p, x1n, x2p, x2n, for example, can be the noninverted (Ip) and inverted (In) inphase component (I) or the noninverted (Qp) and inverted (Qn) quadrature phase component (Q) of a local oscillator signal in the gigahertz range. Circuit arrangement 2 makes certain that at its output the components x1p and x2p (and thereby signals x1 and x2) have as precisely as possible a predefined phase difference phi_target, which in this case (I/Q offset) is 90 degrees.

In circuit arrangement 2, each of the N≧2 basic circuits 20 have a trace 11p for transmitting component x1p, a trace 11n for transmitting x1n, a trace 12p for transmitting component x2p, and a trace 12n for transmitting x2n. In addition, each basic circuit has a controllable phase-influencing means 23, connected to its traces 11p, 11n, 12p, 12n, for controllably influencing the phases of all four components x1p, x1n, x2p, x2n.

Furthermore, circuit arrangement 2 has a phase difference detector 14 and a control unit 15 connected downstream, which are designed in analogy to the corresponding units of the exemplary embodiment previously described with reference to FIG. 1.

Each controllable phase-influencing means 23 has (at least) one upper series connection 17, connected between upper traces 11p, 11n and connected to control unit 15 and comprising two tunable capacitive units 16p, 16n, which uniformly delay both components x1p, x1n depending on one of the first control signals vt1, vt2, (both capacitive units of the same series connection are supplied with the same first control signal). In addition, each controllable phase-influencing means 23 has (at least) one lower series connection 17', connected between lower traces 12p, 12n and also connected to control unit 15 and comprising two tunable capacitive units 16p', 16n', which uniformly delay the two components x2p, x2n depending on one of the second control signals vt1', vt2', . . . . Tunable capacitive units 16p, 16n, 16p', 16n' may have a discretely settable and/or a continuously settable capacitance value.

Control unit 15 tunes capacitive units 16p, 16n and 16p', 16n' by means of the N first control signals (vt1, vt2, . . . ) or the N second control signals (vt1', vt2', . . . ) in such a way that components x1p, x1n during transmission over their traces experience a uniform (matching) total time delay T1 and components x2p, x2n during transmission a uniform total time delay T2, so that due to the possibly resulting time offset T1-T2, the predefined phase difference phi_target arises between components x1p and x2p and thereby also between signals x1 and x2.

In a preferred embodiment, all capacitive units 16p, 16n, 16p', 16n' are designed as identical, so that they have the same capacitance value C at a matching value of their respective control signal. Integrated circuit arrangements of this type can be advantageously developed and realized very simply and cost-effectively.

In another advantageous embodiment, all (or at least most, see below) phase-influencing means 23 are controlled by two-valued control signals, which, e.g., can assume only the voltage values of 3 V or 0 V. Each capacitive unit 16p, 16n, 16p', 16n', depending on the applied value of its control signal in each case, assumes either a first (e.g., minimal) capacitance value Cmin or else a second (e.g., maximum) capacitance value Cmax, so that the capacitive units are formed switchable between these capacitance values. An integrated circuit arrangement of this type with phase-influencing means controlled in a digital or binary fashion is especially simple to realize.

Preferably, control unit 15 generates the two-valued first and second control signals so that index-equivalent-control-signals are "inverse" to one another. For the control signals with the index 1, this means, for example, that the second control signal vt1' assumes the voltage value of, 0 V, if the first control signal vt1 has the value 3 V, and vt1'=3 V, if vt1=0 V. In each phase-influencing means 23, therefore, capacitive units 16p, 16n of the upper series connection(s) 17 assume the capacitance value Cmin, when capacitive units 16p', 16n' of the lower series connection(s) 17' assume the capacitance value Cmax, and vice versa.

Advantageously, control unit 15 controls phase-influencing means 23 so that in the idle state of the circuit arrangement (phi_actual=phi_target), in approximately half of the phase-influencing means 23, the upper capacitive units 16p, 16n assume the capacitance value Cmax and the lower units 16p', 16n' the value Cmin, whereas this is the opposite in the other half of the phase-influencing means 23 (i.e., 16p, 16n: Cmin; 16p', 16n': Cmax), so that T1=T2. In this way, regulation of the phase offset is advantageously possible in both directions. If it is now necessary for adjusting a phase offset (phi_actual not equal to phi_target) to delay components x1p and x1n more greatly and components x2p and x2n less greatly, control unit 15 controls phase-influencing means 23 so that in more than half (N/2) of the phase-influencing means, the capacitance value Cmax is assumed at the top and the value Cmin at the bottom, so that T1>T2. In the extreme case of a maximum phase difference, all of the upper units 16p, 16n assume the value Cmax and all of the lower units 16p', 16n' the value Cmin. If, conversely, it is necessary for adjusting a phase offset to delay components x1p, x1n less greatly and components x2p, x2n more greatly, control unit 15 controls phase-influencing means 23, so that in less than half of the phase-influencing means the capacitance value Cmax is assumed at the top and the value Cmin at the bottom, so that T1<T2. In the extreme case of a maximum phase difference, in this case, all of the upper units 16p, 16n assume the value Cmin and all of the lower units 16p', 16n' the value Cmax.

Advantageously, control unit 15 hereby controls phase-influencing means 23 so that not all phase-influencing means, which have, e.g., the capacitance value Cmax at the top, are within neighboring basic circuits, but that phase-influencing means that have the value Cmax at the top alternate if possible from basic circuit to basic circuit (in FIG. 2, e.g. from left to right) with phase-influencing means that have the value Cmin at the top. In the idle state, this leads, e.g., at the top to an alternating value sequence from Cmax ($1^{st}$ basic circuit on the left), Cmin ($2^{nd}$ basic circuit), Cmax ($3^{rd}$), Cmin ($4^{th}$), . . . , whereas in the case of a to be adjusted phase offset from left to right the more frequent values (e.g., Cmax) are always interrupted by the less frequent values (e.g., Cmin). By this means, reflection-causing changes in the wave resistance along the transmission lines are advantageously minimized.

It is especially advantageous, apart from a plurality of digitally controlled phase-influencing means, to control some phase-influencing means 23 by analog (continuous-value) control signals. The total time delays T1 and T2 can be tuned very finely in this way, so that the predefined phase difference phi_target is maintained with a higher precision at the output of a circuit-arrangement of this type.

Capacitive units 16p, 16n, 16p', 16n' are preferably formed as varactors, MOS capacitors, or as MOS transistors. In the case of a MOS transistor, the gate terminal is connected to the respective transmission line, whereas the drain and source terminals are connected to one another and to the drain and source terminals of the other MOS transistor in the same series connection.

Preferably, capacitive units 16p, 16n and/or 16p', 16n' are arranged between traces 11p, 11n or between traces 12p, 12n. This type of circuit arrangement advantageously requires only a very small chip area.

In an embodiment, which is not shown, only the phases of components x1p, x1n are influenced but not those of components x2p, x2n. In comparison to FIG. 2, series connection 17' or capacitive units 16p', 16n' are then eliminated, as well as the second control signals vt1', vt2', etc.

Figure 3:
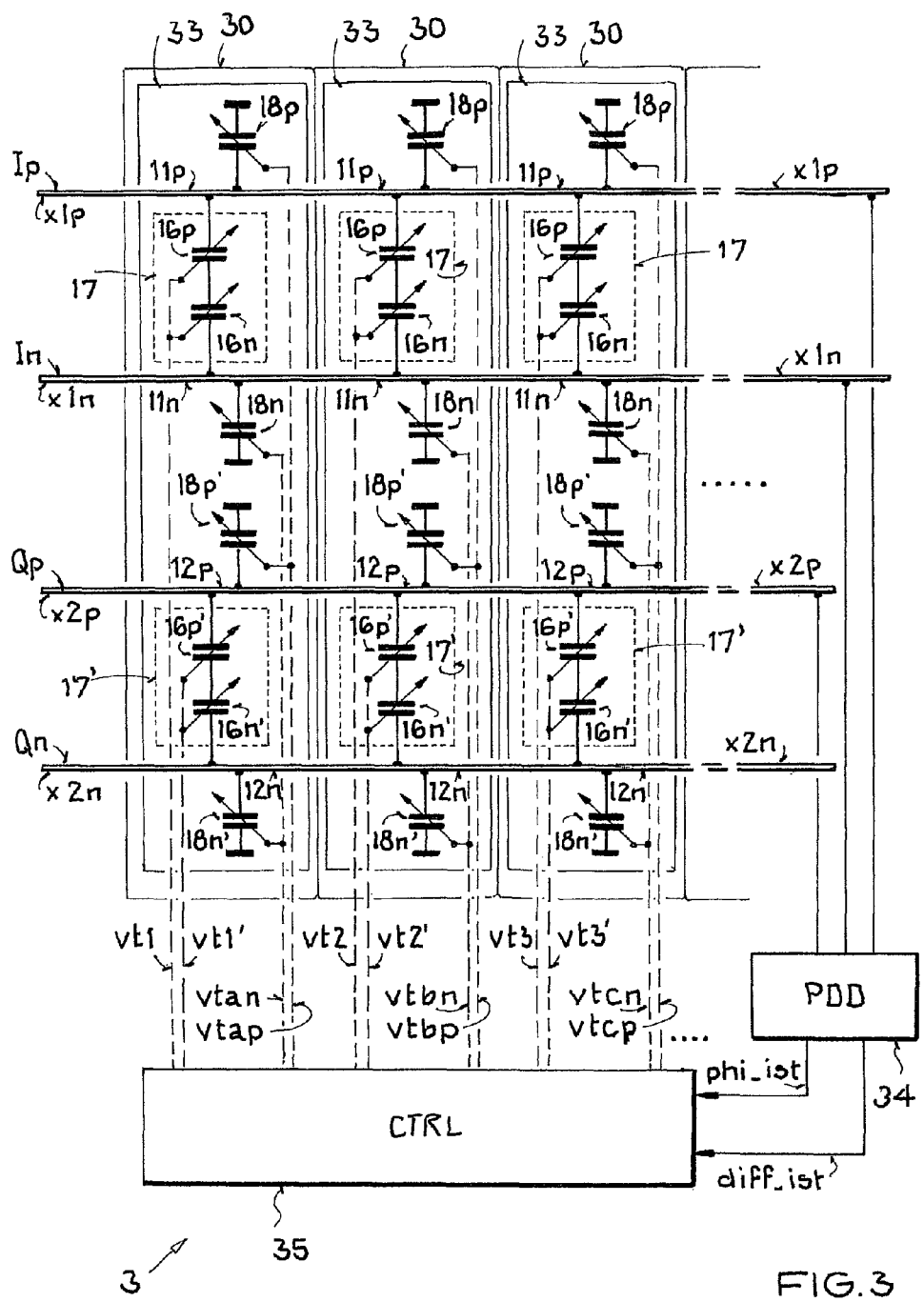
FIG. 3 a third exemplary embodiment of a circuit arrangement of the invention.

FIG. 3 shows a circuit diagram of a third exemplary embodiment for differential signals x1 and x2, in which: in comparison to the previously described second exemplary embodiment, it is assured in addition that the phase difference between the two components x1p and x1n and also between components x2p and x2n is 180 degrees as precisely as possible.

In circuit arrangements 3, each of the N≧2 basic circuits 30 has four traces 11p, 11n, 12p, 12n and a controllable phase-influencing means 33, connected to said traces, for controllably influencing the phases of all four components x1p, x1n, x2p, x2n.

In comparison with the exemplary embodiments previously described with reference to FIGS. 1 and 2, phase difference detector 34 of circuit arrangement 3, apart from the phase difference phi_actual between the noninverted components x1$p$ and x2$p$, also detects the current phase difference diff_actual, e.g., between the two components x1$p$ and x1$n$ and/or between components x2$p$ and x2$n$. It can be frequently assumed that the deviations from the expected 180-degree phase offset in the differential signal x1 (I component) correlate greatly with those in the differential signal x2 (Q component), for which reason the detection of the current phase difference between the components of only one signal, e.g., x1, is sufficient.

To control phase-influencing means 33, control unit 35 generates in addition to the first and second control signals (vt1, vt2, ..., vt1', vt2', ...) N third control signals vtap, vtbp, ... and N fourth control signals vtan, vtbn, ..., which depend on the current (actual) phase difference diff_actual. These control signals can also be formed as a digital control voltage, which, for example, can assume only two different voltage values (e.g., 0 V, 3 V), or as an analog control voltage with continuous values, e.g., between 0 V and 3 V.

Apart from capacitive units 16$p$, 16$n$, 16$p$', 16$n$', shown in FIG. 2 and connected and controlled in conformity with the second exemplary embodiment, each phase-influencing means 33 according to FIG. 3 for influencing the phase of x1$p$ has (at least) one tunable capacitive unit 18$p$, connected to trace 11$p$, a reference potential (AC ground) and control unit 35, and for influencing the phase of x2$p$ (at least) one tunable capacitive unit 18$p$', connected to trace 12$p$, a reference potential (AC ground), and control unit 35. Both capacitive units 18$p$, 18$p$' of the same phase-influencing means 33 are hereby controlled by one and the same third control signal vtap, vtbp, .... In addition, each phase-influencing means 33 for influencing the phases from x1$n$ and x2$n$ has (at least) two other, accordingly connected tunable capacitive units 18$n$, 18$n$', which are controlled in each case by one of the fourth control signals vtan, vtbn, .... Tunable capacitive units 18$p$, 18$n$, 18$p$', 18$n$' can have a discretely settable and/or a continuously settable capacitance value.

Control unit 35 tunes capacitive units 18$p$, 18$n$, 18$p$', 18$n$' by means of the third and fourth control signals in such a way that components x1$p$ and x2$p$ during transmission over their traces experience a total time delay T3 and components x1$n$ and x2$n$ during transmission, a total time delay T4, so that due to the possibly resulting time offset T3-T4, the predefined phase difference diff_target of 180 degrees arises between components x1$p$ and x1$n$ and between x2$p$ and x2$n$ and thereby precisely differential signals x1 and x2 are present. Preferably, after precisely differential signals x1, x2 are present, control unit 35, as previously described with reference to FIG. 2, also tunes capacitive units 16$p$, 16$n$, 16$p$', 16$n$', so that the predefined I/Q phase difference of phi_target=90 degrees arises between components x1$p$ and x2$p$ and thereby between signals x1 and x2. In alternative embodiments, an internal regulation of the differential phase offset can also be combined with an external regulation of the I/Q phase offset, so that the differential phase offset is set, overlapping in time with the I/Q phase offset, to the value desired in each case.

In a preferred embodiment, all capacitive units 18$p$, 18$n$, 18$p$', 18$n$' are designed as identical, so that they have the same capacitance value C at a matching value of their respective control signal. Integrated circuit arrangements of this type can be advantageously developed and realized very simply and cost-effectively.

In another advantageous embodiment, all phase-influencing means 33 are controlled by two-valued third and fourth control-signals, which, e.g., can assume only the voltage values of 3 V or 0 V. Each capacitive unit 18$p$, 18$n$, 18$p$', 18$n$', depending on the specifically applied value of its control signal, assumes either a first or else one [sic] capacitance value. An integrated circuit arrangement of this type with phase-influencing means controlled in a digital or binary fashion is especially simple to realize.

It is especially advantageous to control a few phase-influencing means 33 by analog (continuous-value) third and fourth control signals. The total time delays T3 and T4 can be tuned very finely in this way, so that the predefined phase difference diff_target is maintained with a higher precision at the output of a circuit arrangement of this type.

Capacitive units 18$p$, 18$n$, 18$p$', 18$n$' are preferably formed as varactors, MOS capacitors, or as MOS transistors.

In an embodiment (not shown), either only the phases of noninverted components x1$p$, x2$p$ or only the phases of inverted components x1$n$, x2$n$, but not the other components x1$n$, x2$n$ or x1$p$, x2$p$, are influenced in each case to set the 180-degree offset. In comparison with FIG. 3, capacitive units 18$n$, 18$n$' and the fourth control signals vtan, vtbn, ... or else units 18$p$, 18$p$' and the third control signals vtap, vtbp, are then eliminated.

Figure 4:
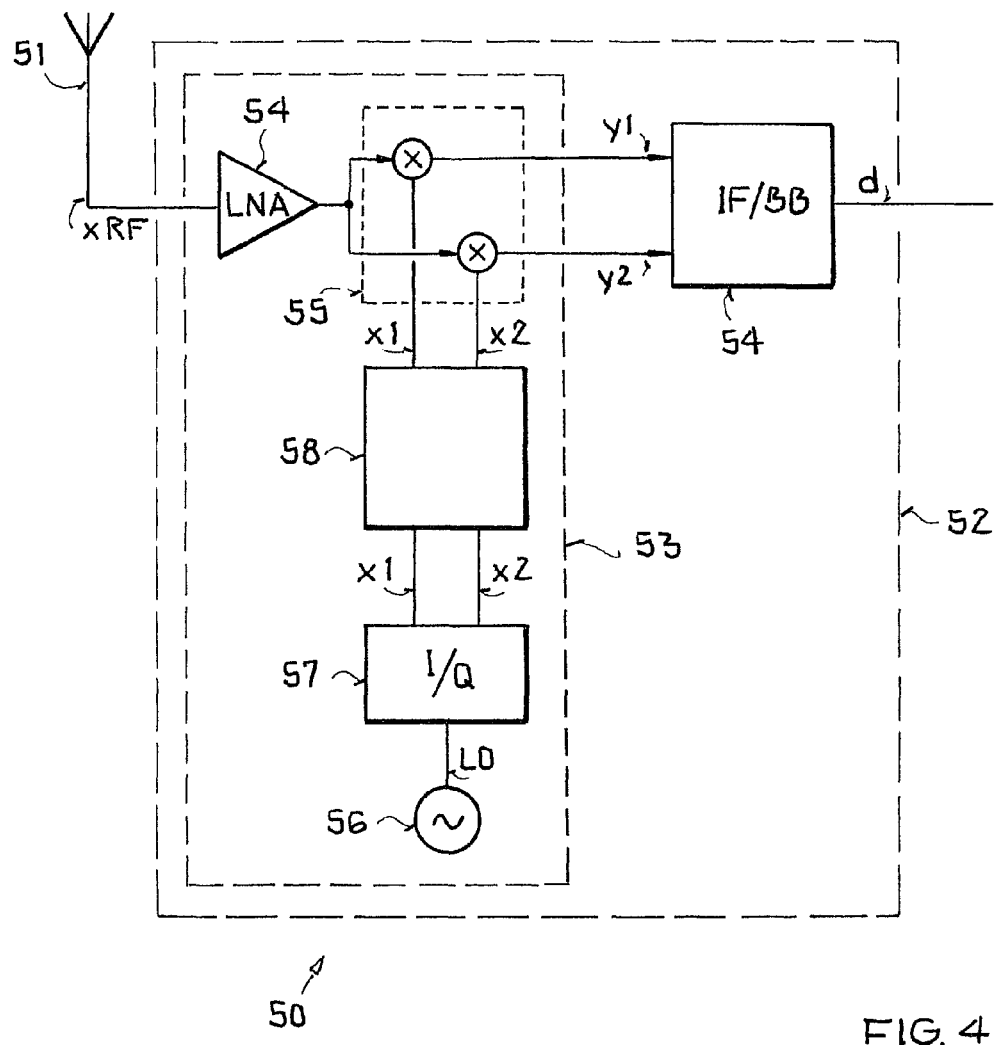
FIG. 4 a block diagram of a WiMax transceiver having a circuit arrangement of the invention.

FIG. 4 shows a simplified block diagram of a transmitting/receiving device for a data transmission system according to IEEE 802.16 ("WiMax," worldwide interoperability for microwave access).

Transmitting/receiving device 50 has an antenna 51 and a transmitting/receiving unit (transceiver) 52 connected to the antenna. Transmitting/receiving unit 52 comprises an HF front-end circuit 53, connected to the antenna, and an IF/BB signal processing unit 54 connected downstream. HF front-end-circuit 53 amplifies a high-frequency radio signal xRF; which is received by antenna 14 and lies spectrally within the microwave range between 3.4 and 3.6 GHz, and converts (transforms) it into a quadrature signal y in an intermediate frequency range (intermediate frequency, IF) or in the baseband range ("zero IF"). The quadrature signal y is a complex-valued signal with an inphase component y1 and a quadrature phase component y2.

The IF/BB signal processing unit 54 filters the quadrature signal y and shifts it perhaps spectrally into the baseband, demodulates the baseband signal, and detects the data d contained therein and originally transmitted by another transmitting/receiving device.

The HF front-end circuit 53 has an amplifier (low noise amplifier, LNA) 54, connected to antenna 51, for amplifying the high-frequency radio signal xRF and a quadrature mixer 55, connected downstream, for converting the amplified signal into the quadrature signal y. Furthermore, the HF front-end circuit 53 has a series connection comprising a local oscillator 56, an I/Q generator 57, and a circuit arrangement 58 of the invention, which is connected to quadrature mixer 55 on the output side.

Local oscillator 56 is preferably a voltage-controlled oscillator (VCO), whose frequency is set, for example, with use of a phase-locked loop (PLL).

I/Q generator 57 derives from the local oscillator signal LO of oscillator 56 a differential inphase signal x1 and a differential quadrature phase signal x2 phase shifted by about 90 degrees, said signals which lie, e.g., at a frequency between 3.4 and 3.6 GHz. For example, because of technology or process variations, signals x1 and x2 may have a phase offset deviating from 90 degrees. Optionally, I/Q generator 57 also comprises a frequency divider and amplifier elements. Circuit arrangement 58 makes certain that at its output the phase offset of signals x1 and x2 is 90 degrees as precisely as possible. This is very important for the efficiency of the HF-front-end circuit 53. Circuit arrangement 58 is realized, for example, according to any one or the exemplary embodiments described, previously with reference to FIGS. 2 and 3. A preferred exemplary embodiment is described hereafter with reference to FIG. 5.

The HF front-end circuit 53 and thereby circuit arrangement 58 of the invention and perhaps parts of the IF/BB signal processing unit 54 are preferably a component of an integrated circuit (IC), which is formed, e.g., as a monolithically integrated circuit using a standard technology, as a hybrid circuit (thin- or thick-layer technology), or as a multilayer ceramic circuit.

Figure 5:
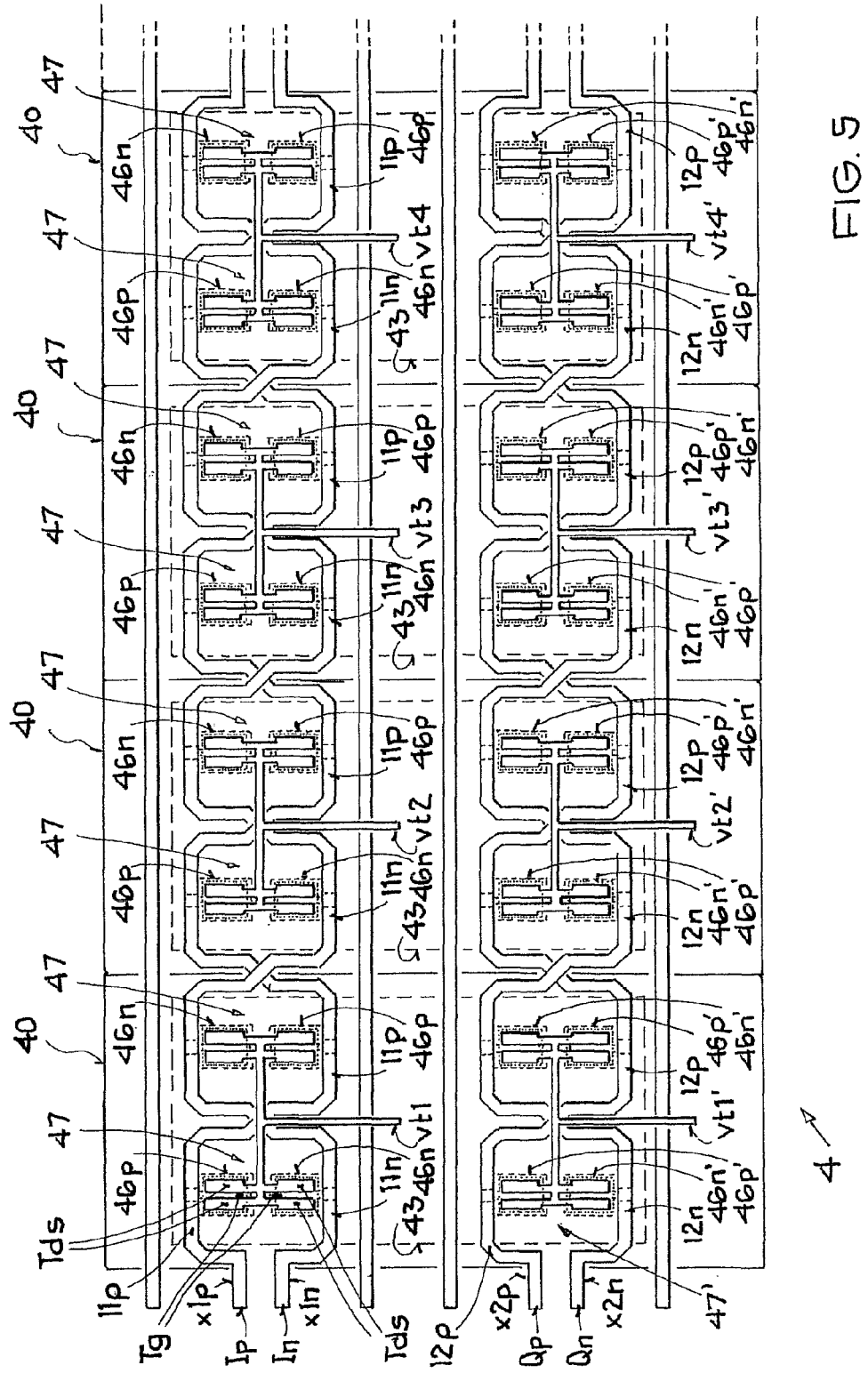
FIG. 5 a fourth, preferred exemplary embodiment of a circuit arrangement of the invention (plan view) for a WiMax transceiver.

FIG. 5 shows schematically a layout of a fourth, preferred exemplary embodiment of a circuit arrangement of the invention for an HF front-end circuit of a WiMax transceiver according to FIG. 4. The following data refer by way of example to an integrated circuit arrangement realized by the applicant using a 0.35 μm BiCMOS technology.

Differential signals x1 and x2 (see FIG. 4) or their components x1p, x1n, x2p, x2n (FIG. 5) have a frequency of around 3.5 GHz and an effective wavelength lambda of approximately 7 cm.

Circuit arrangement 4 has a total of N=50 basic circuits 40, which with the exception of the input area of the first basic circuit and the output area of the $50^{th}$ basic circuit have an identical design.

Each basic circuit 40 has four meander-shaped, paired symmetric traces 11p, 11n, 12p, 12n for transmitting signal components x1p, x1n, x2p, x2n, four straight ground traces for shielding, and a controllable phase-influencing means 43, connected to the meander-shaped traces, for controllably influencing the phases of components x1p, x1n, x2p, x2n.

Because of the meander-shaped design of the traces, advantageously long electrical lengths, or phase shifts are achieved with relatively small geometric dimensions. Because of the parallel trace sections, running vertically at a relatively small distance, with a codirectional current flow, the magnetic fields become greatly amplified in the exterior space surrounding these trace sections. This leads to an increase in the magnetic coupling and thereby the quality of the specific transmission line.

Each basic circuit requires a chip area of 20 μm×20 μm (the diagram in FIG. 5 is horizontally compressed), so that all 50 basic circuits together occupy a total area of 20 μm×1 mm of the integrated circuit. Thereby, circuit arrangement 4 of the invention advantageously takes up no additional chip area, the more so as quadrature mixer 55 and local oscillator 56 (see FIG. 4) in the integrated circuit are to be arranged in any event at a distance of about 1-2 mm, in order to reduce the feedback effects of the mixer on the oscillator.

Furthermore, circuit arrangement 4 has a phase difference detector (PDD, not shown) and a control unit (CTRL) (also not shown), which are preferably connected and designed in conformity with the corresponding units of the exemplary embodiment previously described with reference to FIG. 2.

Each controllable phase-influencing means 43 has two upper series connections 47, connected between upper traces 11p, 11n and comprising two tunable capacitive units 46p, 46n, which uniformly delay the two components x1p, x1n depending on one of the first control signals vt1, vt2, . . . in each case (all four capacitive units 46p, 46n are supplied with the same first control signal). In addition, each phase-influencing means 43 has two lower series connections 47', connected between lower traces 12p, 12n and comprising two tunable capacitive units 46p', 46n', which uniformly delay the two components x2p, x2n depending on one of the second control signals vt1', vt2' . . . in each case.

All capacitive units 46p, 46n, 46p', 46n' are hereby formed identical and realized as MOS transistors (MOSFET), whereby the respective control signal is applied to the interconnected drain and source terminals Tds (the connection point forms an AC ground) and the gate terminal T1g is connected to the respective meander-shaped trace. At a voltage value of the control-signal, applied in each case, of, for example, 0 V; each MOS transistor has a capacitance value Cmin=3 fF and at a voltage value of 3 V a capacitance value Cmax=5 fF.

As explained previously with reference to the second exemplary embodiment (FIG. 2), the control unit controls all 50 (or at least most, see further below) phase-influencing means 43 with two-valued control signals, whereby index-equivalent control signals (e.g., vt1, vt1') are inverse relative to one another. In addition, the control signals are generated so that in the idle state of circuit-arrangement 4 (phi_actual=phi_target), in about 25 phase-influencing means 43, the upper (lower) capacitive units 46p, 46n (46p', 46n') assume the capacitance value Cmax (Cmin), whereas this is the converse in the other approximately 25 phase-influencing means 43. With these requirements, it is possible with circuit arrangement 4 to adjust phase differences from phi_actual=80 degrees to phi_actual=100 degrees to phi_target=90 degrees, so that the entire control range has a width of 100−80=20 degrees and the precision (resolution) is 20/50 degrees=0.4 degrees. The circuit arrangement of the invention therefore advantageously has a broad control range and a high resolution.

To further increase the resolution, it can be advantageous to control, apart from a plurality of digitally controlled phase-influencing means (e.g., 48 or 49), some (e.g., two or one) phase-influencing means 43 by analog (continuous-value) control signals. In this way, it is possible to maintain the predefined phase difference phi_target with a still greater precision at the output of a circuit arrangement of this type.

In further exemplary embodiments, of course, numbers of basic circuits different from N=50 may be provided. The number N nevertheless is to be selected preferably so that the electrical length of an individual basic circuit, which in the above example is about 0.35 mm is less than a tenth of the effective wavelength (in the above example, lambda/10=7 mm).

Each circuit arrangement of the invention may be used in principle also with other frequencies or in other frequency bands. Thus, for example, the exemplary embodiment described above with reference to FIG. 5 may be used without modification at an operating frequency of 7 GHz instead of 3.5 GHz. The width of the control range doubles in this case from 20 to 40 degrees.

The invention claimed is:

1. An integrated circuit for a transmitting/receiving device of a data transmission system according to IEEE 802.16, having an oscillator, a quadrature mixer, and a circuit arrangement, connected to the oscillator and the quadrature mixer, comprising:

a chain connection of a plurality of basic circuits, wherein each basic circuit has a first transmission line for transmitting the first signal, a second transmission line for transmitting the second signal, and a controllable phase-influencing device connected to the first transmission line for controllably influencing the phase of the first signal;

a phase difference detector, which is connected to an output side basic circuit and is formed to detect a current phase difference between the first and second signals; and a control unit, which is connected to the phase difference detector and each controllable phase-influencing device and is formed to generate first digital control voltages, dependent on the current phase difference as control signals for each phase-influencing device, wherein the digital control voltage can assume only two different voltage values, and wherein each controllable phase-influencing device has at least one first tunable capacitive unit, which is connected to the first transmission line and the control unit and is designed to delay the first signal depending on the digital control voltage of the first control signals.

2. The circuit according to claim 1, wherein the circuit is designed as a monolithically integrated circuit, as a hybrid circuit, or as a multilayer ceramic circuit.

3. An integrated circuit arrangement for setting a predefined phase difference between a first high-frequency signal and a second high-frequency signal, comprising:

a chain connection of a plurality of basic circuits, wherein each basic circuit has a first transmission line for transmitting the first signal, a second transmission line for transmitting the second signal, and a controllable phase-influencing device connected to the first transmission line, for controllably influencing a phase of the first signal;

a phase difference detector, which is connected to an output-side basic circuit and is formed to detect a current phase difference between the first and second signals;

a control unit, which is connected to the phase difference detector and each controllable phase-influencing device and is formed to generate first digital control voltages, dependent on the current phase difference as control signals for each phase-influencing device, wherein the digital control voltage can assume only two different voltage values; and wherein each controllable phase-influencing device has at least one first tunable capacitive unit, which is connected to the first transmission line and the control unit and is designed to delay the first signal depending on the digital control voltage of the control signals, wherein the number of basic circuits is selected so that the electrical length of an individual basic circuit is less than a tenth of the effective wavelength of the first high-frequency signal.

4. An integrated circuit arrangement for setting a predefined phase difference between a first high-frequency signal and a second high-frequency signal, comprising:

a chain connection of a plurality of basic circuits, wherein each basic circuit has a first transmission line for transmitting the first signal, a second transmission line for transmitting the second signal, and a controllable phase-influencing device connected to the first transmission line, for controllably influencing a phase of the first signal; a phase difference detector, which is connected to an output-side basic circuit and is formed to detect a current phase difference between the first and second signals; and a control unit, which is connected to the phase difference detector and each controllable phase-influencing device and is formed to generate first digital control voltages, dependent on the current phase difference as control signals for each phase-influencing device, wherein the digital control voltage can assume only two different voltage values, and wherein each controllable phase-influencing device has at least one first tunable capacitive unit, which is connected to the first transmission line and the control unit and is designed to delay the first signal depending on the digital control voltage of the control signals, and wherein the control unit is designed in addition to generate analog control voltages, dependent on the current phase difference as continuous-value control signals for at least one of the phase-influencing devices.

5. The circuit arrangement according to claim 4, wherein the basic circuits are designed substantially identical.

6. The circuit arrangement according to claim 4, wherein the first and second transmission lines are designed as traces.

7. The circuit arrangement according to claim 4, wherein the first and second high frequency signals are in the microwave frequency range.

8. The circuit arrangement according to claim 4, wherein the control unit is designed to tune the at least one first capacitive units in such a way that the first signal, when it is transmitted over the first transmission lines, experiences a first total time delay, so that the predefined phase difference arises between the first and second signals.

9. The circuit arrangement according to claim 4, wherein each first transmission line has a first trace for transmitting a noninverted first component of the first signal and a second trace for transmitting an inverted second component of the first high-frequency signal, wherein the controllable phase-influencing device of each basic circuit is connected to the first and second traces for controllably influencing the phases of the first and second components, wherein each controllable phase-influencing device has at least one first series circuit, which is connected between the first and second traces and is connected to the control unit, and each controllable phase-influencing device comprises two first tunable capacitive units and is designed to delay the first and second components depending on one of the control signals, and wherein the control unit is designed to tune the two first tunable capacitive units in such a way that the first and second components, when they are transmitted over the first or second traces, experience a matching first total time delay, so that the predefined phase difference arises between the first and second signals.

10. The circuit arrangement according to claim 9, wherein the first trace is arranged symmetrically to the second trace.

11. The circuit arrangement according to claim 9, wherein the two first tunable capacitive units are arranged between the first and second traces.

12. The circuit arrangement according to claim 4, wherein the control unit has a conversion unit or an analog-to-digital converter.

13. The circuit arrangement according to claim 4, wherein all first capacitive units are identical.

14. The circuit arrangement according to claim 4, wherein the at least one first capacitive units are formed switchable in such a way that they have a particular value of a total of two different capacitance values depending on the value of the applied the control signal.

15. The circuit arrangement according to claim 4, wherein the respective controllable phase-influencing device is connected to the respective second transmission line of each basic circuit, for controllably influencing the phase of the second signal, the control unit is formed to generate at least two second control signals dependent on the current phase difference, each controllable phase-influencing device has at least one second tunable capacitive unit, which is connected to the second transmission line and the control unit and is designed to delay the second signal depending on one of the second control signals, and wherein the control unit is designed to tune the second capacitive units in such a way that the second signal, when it is transmitted over the second transmission line, experiences a second total time delay, so that the predefined phase difference arises between the first and second signals.

16. The circuit arrangement according to claim 15, wherein the second transmission line has a third trace for transmitting a noninverted third component of the second signal and a fourth trace for transmitting an inverted fourth component of the second signal, wherein each basic circuit has the controllable phase-influencing device connected to the third and fourth trace for controllably influencing the phases of the noninverted third and inverted fourth components, wherein each controllable phase-influencing device has at least one second series circuit, which is connected between the third and fourth trace and is connected to the control unit, comprises two second tunable capacitive units, and is designed to delay the third and fourth component depending on one of the second control signals, and wherein the control unit is designed to tune the second capacitive units in such a way that the third and fourth components, when they are transmitted over the third or fourth traces, experience a matching second total time delay so that the predefined phase difference arises between the first and second signals.

17. The circuit arrangement according to claim 15, wherein all first and second capacitive units are designed as identical.

18. The circuit arrangement according to claim 15, wherein the at least one tunable second capacitive unit are formed switchable in such a way they have a particular value of a total of two different capacitance values depending on the value of the applied second control signal.

19. The circuit arrangement according to claim 15, wherein at least one first and at least one second control signal is formed to assume precisely two different values, wherein the second control signal assumes a first value when the first control signal assumes a second value and the second control signal assumes the second value when the first control signal assumes the first value.

20. The circuit arrangement according to claim 4, wherein at least one of the capacitive units is designed as a varactor, MOS capacitor, or MOS transistor.

21. An integrated circuit arrangement for setting a predefined phase difference between a first high-frequency signal and a second high-frequency signal, comprising:

a chain connection of a plurality of basic circuits, wherein each basic circuit has a first transmission line for transmitting the first high-frequency signal, a second transmission line for transmitting the second signal, and a controllable phase-influencing device connected to the first transmission line, for controllably influencing the phase of the first high-frequency signal;

a phase difference detector, which is connected to an output-side basic circuit and is formed to detect a current phase difference between the first and second signals; and a control unit, which is connected to the phase difference detector and each controllable phase-influencing device and is formed to generate first digital control voltages, dependent on the current phase difference as control signals for each phase-influencing device, wherein the digital control voltage can assume only two different voltage values, wherein each controllable phase-influencing device has at least one first tunable capacitive unit, which is connected to the first transmission line and the control unit and is designed to delay the first signal depending on the digital control voltage of the control signals, wherein the phase difference detector is formed to detect another current phase difference between the first and second components, wherein the control unit is formed to generate at least two third control signals and at least two fourth control signals, which depend on the additional current phase difference, wherein each controllable phase-influencing device has at least one third tunable capacitive unit, which is connected to the first transmission line and the control unit and is designed to delay the first component depending on one of the third control signals, wherein each controllable phase-influencing device has at least one fourth tunable capacitive unit, which is connected to the second transmission line and the control unit and is designed to delay the second component depending on one of the fourth control signals, and wherein the control unit is designed to tune the third and fourth capacitive units in such a way that the first and second components, when they are transmitted over their respective transmission lines, experience a third or fourth total time delay, respectively, so that another predefined phase difference arises between the first and second component.

* * * * *